United States Patent
Diemunsch

(10) Patent No.: US 10,688,860 B2
(45) Date of Patent: Jun. 23, 2020

(54) VEHICLE WITH ELECTRIC MOTOR CONTROLLED BY A POWER FOR SUCH A POWER MODULE

(71) Applicant: INSTITUT VEDECOM, Versailles (FR)

(72) Inventor: Guy Diemunsch, Fontaine (FR)

(73) Assignee: INSTITUT VEDECOM, Versailles (FR)

( * ) Notice: Subject to any disclaimer, the term of this patent is extended or adjusted under 35 U.S.C. 154(b) by 49 days.

(21) Appl. No.: 16/084,113

(22) PCT Filed: Mar. 8, 2017

(86) PCT No.: PCT/FR2017/050513
§ 371 (c)(1),
(2) Date: Sep. 11, 2018

(87) PCT Pub. No.: WO2017/158257
PCT Pub. Date: Sep. 21, 2017

(65) Prior Publication Data
US 2019/0077249 A1 Mar. 14, 2019

(30) Foreign Application Priority Data
Mar. 15, 2016 (FR) .................... 16 52197

(51) Int. Cl.
*B60K 11/06* (2006.01)
*B60K 1/00* (2006.01)
(Continued)

(52) U.S. Cl.
CPC ............... *B60K 11/06* (2013.01); *B60K 1/00* (2013.01); *B60K 11/08* (2013.01);
(Continued)

(58) Field of Classification Search
CPC .. B60K 11/06; B60K 11/08; B60K 2001/003; B60K 2001/005; B60K 2001/006;
(Continued)

(56) References Cited

U.S. PATENT DOCUMENTS

| 5,481,443 A | 1/1996 | Wagner et al. |
| 2007/0246635 A1* | 10/2007 | Nakajima .......... H05K 7/20927 248/637 |

(Continued)

FOREIGN PATENT DOCUMENTS

| EP | 2896529 A1 | 7/2015 |
| FR | 3021257 A1 | 11/2015 |

OTHER PUBLICATIONS

International Search Report for corresponding PCT/FR2017/050513 dated Jun. 6, 2017.
(Continued)

*Primary Examiner* — Tho V Duong
(74) *Attorney, Agent, or Firm* — Sandberg Phoenix & von Gontard, P.C.

(57) ABSTRACT

The invention relates to a motorised vehicle (10) comprising (i) an electric motor (130) situated in an engine compartment (11), the said electric motor (130) being designed to propel the vehicle (10), (ii) a cabin (12) of the vehicle (10), separated from the engine compartment (11) by a dividing wall (70), (iii) an energy storage device (23) configured to supply electrical power to the electric motor (130), (iv) a power module (110) designed to shape at least one electric power signal configured to power the electric motor (130), the said power module (110) being situated between the electric motor (130) and the cabin (12).

14 Claims, 4 Drawing Sheets

(51) Int. Cl.
*B60K 11/08* (2006.01)
*H05K 7/20* (2006.01)
(52) U.S. Cl.
CPC .... *H05K 7/20418* (2013.01); *B60K 2001/003* (2013.01); *B60L 2240/525* (2013.01); *H05K 7/20145* (2013.01)
(58) Field of Classification Search
CPC ... B60K 1/00; B60L 53/302; B60L 2440/525; B60H 1/00278; B60H 1/00564; H05K 7/20418; H05K 7/20145
See application file for complete search history.

(56) References Cited

U.S. PATENT DOCUMENTS

| | | | | |
|---|---|---|---|---|
| 2007/0289789 | A1* | 12/2007 | Tsuchiya | B60K 1/04 180/68.2 |
| 2009/0260905 | A1* | 10/2009 | Shinmura | B60K 1/04 180/68.1 |
| 2010/0231035 | A1* | 9/2010 | Tsuchiya | B60H 1/00278 307/9.1 |
| 2012/0247848 | A1* | 10/2012 | Kosaka | B60H 1/00278 180/68.1 |
| 2015/0246607 | A1 | 9/2015 | Matsuda | |
| 2015/0291019 | A1* | 10/2015 | Hatta | B60K 11/06 180/68.2 |

OTHER PUBLICATIONS

Written Opinion for corresponding PCT/FR2017/050513 dated Jun. 6, 2017.

* cited by examiner

VEHICLE WITH ELECTRIC MOTOR CONTROLLED BY A POWER FOR SUCH A POWER MODULE

CROSS-REFERENCE TO RELATED APPLICATIONS

The application is the US National Stage under 35 USC § 371 of International App. No. PCT/FR2017/050513 filed Mar. 8, 2017, which in turn claims the priority to French application 1652197 filed Mar. 15, 2016 whose content (text, drawings and claims) of both applications being incorporated by reference.

TECHNICAL AREA

The present invention relates to a motor vehicle, and more particularly to a vehicle propelled by at least one motor at least partially powered by electrical energy.

STATE OF THE PRIOR ART

Vehicles which are propelled at least partially by an electric motor are controlled by a power module which delivers to a corresponding electric motor at least one power signal for controlling its rotational speed.

Such power modules comprise a plurality of electronic components that amplify and shape the at least one electrical power signal.

In a known manner, these power modules are subject to numerous stresses during their operation, in particular mechanical and thermal stresses. Thus, heat dissipation induced at the level of the plurality of electronic components during their operation generate thermomechanical stresses repeated cyclically throughout the life of the module, producing thermal fatigue, mechanical stress, and consequently risks of malfunction and/or failures of the power module and, ultimately, of the vehicle on which the power module is located.

U.S. Pat. No. 5,481,433 discloses a cooling system for such a power module, the heat exchanger of which comprises an air duct running along the power module in order to extract the heat generated at the power module. However, this configuration is rather limited because the cooling of the power module is only ensured by the circulation of air in the duct during the movement of the vehicle. When the vehicle is stopped, the air no longer circulates and the cooling of the power module is therefore no longer as effective. It is thus necessary to imagine new strategies for cooling the power module that are more efficient no matter the use of the vehicle, whether at a standstill or in operation.

In addition, the power modules used on vehicles to drive their electric motors generate power signals that generally have a high amperage. In the event of a major malfunction, and particularly in accident situations during which the physical integrity of the vehicle has been impaired, the power modules may constitute sources of danger for the passengers of the vehicle or for emergency personnel. Indeed, in these situations, power modules can represent sources of short circuits leading to fire or electric shock. It is therefore necessary to design safer vehicles in which the risk of fire is reduced in case of accidents.

The object is to provide a cooling system which responds at least in large part to the above problems and to furthermore provide other advantages.

Another object is to solve at least one of these problems by a new vehicle whose propulsion is provided at least partially by an electric motor.

Another object is to limit the risk of fire of the power module in case of accident of the vehicle.

Another object is to provide more efficient and more robust cooling of the power module driving the engine, in all circumstances of use of the vehicle.

SUMMARY OF THE INVENTION

In the remainder of the specification and in the claims, the term "forward" will be used in a non-limiting manner and in order to facilitate understanding, to designate a position oriented in the direction of the normal displacement of a vehicle—in its current and main use—or toward the hood of the vehicle, and the term "backward" to designate a position oriented in the direction corresponding to the reverse motion of a vehicle or toward the trunk of the vehicle.

The term "longitudinal" is used to designate the greatest length of the vehicle, generally corresponding to the direction of its displacement.

The term "cross section" designates a section made in a plane perpendicular to the object or part of the object from which it is derived.

The subject of the present invention is, on the one hand, any vehicle whose propulsion is partially provided by an electric motor, such as, for example, hybrid vehicles and vehicles whose propulsion is completely provided by an electric motor.

Even if certain specific configurations will be detailed in particular embodiments of the invention, the present invention covers all engine architectures, including vehicle configurations comprising a single central engine or several satellite engines, such as, for example, an electric motor by driving wheel or electric motor by undercarriage.

According to a first aspect, at least one of the aforementioned objectives is attained with a motorized vehicle comprising (i) an electric motor located in an engine compartment, the electric motor being arranged to propel the vehicle, (ii) a passenger compartment, separated from the engine compartment by a separation wall, (iii) an energy storage device configured to supply electric power to the electric motor, (iv) a power module arranged to form at least one electrical power signal configured for powering the electric motor, the power module being located between the electric motor and the passenger compartment.

Generally speaking, the power module driving the corresponding electric motor is placed in a position as far as possible from the lateral, front and rear edges of a vehicle, so that, in case of accident, the power module is as protected as possible from impacts on the body and so as to ensure the physical integrity of the power module. In addition, the electric motor, generally having a higher mass, is more difficult to move in case of an accident of the vehicle and, therefore, this configuration advantageously protects the power module associated with the electric motor. This configuation thus reduces the risk of fire of the power module in case of accident of the vehicle.

More particularly, the present invention aims to define a longitudinal and/or transverse position of the power module inside the vehicle.

In the case of a vehicle—hybrid or electric—comprising a single electric motor coupled to the driving wheels, the power module is advantageously included in the engine compartment, on the side of the passenger compartment: if the engine compartment or the electric motor is located at the rear of the vehicle, then the power module is located in front of the engine, between the engine and the passenger compartment; and if the engine compartment or the electric motor is located at the front of the vehicle, then the power module is located behind the engine and in front of the passenger compartment.

In the case of a vehicle comprising several electric motors, such as, for example, a wheel-driven electric motor, the power module is preferably located laterally inwardly relative to the corresponding electric motor.

Preferably, in a vehicle according to the first aspect, the power module is located, in the longitudinal direction, behind an axis of rotation of one of the front wheels of the vehicle. This advantageous configuration thus makes it possible to place the power module in a more central position of the vehicle. Thus, in the event of a minor accident during which the body of the vehicle is simply creased along an impact zone and/or when the vehicle is slightly damaged, the power module is not damaged because it is located in a position away from the impact zone. This configuration makes it possible to protect the power module in the event of minor accidents, thus avoiding any additional dangers for the vehicle, its occupants and/or the emergency personnel intervening on the scene of the accident. This configuration also makes it possible not to have to replace or repair the power module in the event of minor accidents of the vehicle. By contrast, it is only in the case of accidents in which the front end of the vehicle is pushed in towards the back that the power module could be damaged, but in such accidents the vehicle is often irreparable.

Inside the engine compartment, so-called natural ventilation of the power module may not be sufficient, and it is useful to provide forced ventilation in order to improve the cooling of the power module. For this purpose, the vehicle, according to the first aspect, comprises at least one air duct arranged to guide the air along a guiding profile, between an inlet mouth located on a front portion of the vehicle, and an outlet mouth located at the power module.

The guiding profile designates the median axis of the air duct and defines the path along which the air is guided inside the air duct. In the particular case of an air duct of a generally cylindrical shape, the guiding profile corresponds to the generator of the corresponding cylinder.

The guiding profile can have any shape depending on the space available inside the vehicle and/or the engine compartment, from linear profiles to curvilinear profiles comprising any number of inflection points.

The guiding profile is preferably a non-firm profile, comprising a first end and a second end. The inlet mouth of the air duct is located at the first end, and the outlet mouth of the air duct is located at the second end.

In a plane perpendicular to the guiding profile, the air duct is shaped by a guiding curve describing any firm profile. Preferably, the guiding curve takes the shape of a circle, an ellipse or a rectangle whose corners may be rounded.

Preferably, the guiding curve is identical between the first and the second end of the guiding profile, except, possibly, with a homothetic transformation.

Alternatively, the guiding curve has a different shape between the first and second ends of the guiding profile in order to define a particular air flow profile inside the air duct.

Due to this variant embodiment of the first aspect, it is possible to better cool the power module inside the engine compartment and/or the vehicle. Due to the air duct, the air coming from the outside of the vehicle is guided through the vehicle and the engine compartment to be directly injected at the power module. Thus, the natural ventilation of the power module is completed, or even replaced, by the forced ventilation which allows for increased heat exchanges between the power module and the external environment.

More preferably, the forced ventilation as provided in this variant embodiment allows for generation of an air flow proportional to the traveling speed of the vehicle. As the traveling speed is generally related to the power developed by the electric motor, this variant embodiment thus cleverly allows for generation of an air flow for the cooling of the power module which is proportional to the stress of the power module.

In this variant embodiment, the air duct is thus arranged to achieve a cooling of the power module which is self-regulating: the more the power module is stressed, the more it delivers strong currents to the electric motor so that it develops a high rotational speed which allows the vehicle to move faster, and the more the power module heats up. But, at the same time, the high traveling speed of the vehicle allows for introduction of a larger amount of fresh air taken outside the vehicle and injected at the power module, thus allowing to cool it more.

Such a vehicle may comprise, alternately or complementarily, at least one of the first improvements below, taken optionally in combination:
  the air duct is arranged so that the air velocity and/or the Reynolds number exiting at the outlet mouth is greater than the air velocity and/or the Reynolds number entering at the inlet mouth in order to further improve the heat exchanges at the power module with fresh air from outside the vehicle and the engine compartment and, ultimately, to improve the cooling of the power module. More particularly, at least one lateral dimension of a cross section of the inlet mouth of the air duct is greater than a corresponding lateral dimension of a cross section of the outlet mouth. In other words, in a plane perpendicular to the guiding profile of the air duct, the dimension of a lateral side of the generating curve taken at the inlet mouth is greater than the same side dimension of the generating curve taken at the exit mouth of the air duct.
  the lateral dimension of the cross section decreases monotonically between the inlet mouth and the outlet mouth. In other words, along the guiding profile of the air duct, the dimension of a lateral side of the generating curve decreases monotonically, and preferably linearly, between a first end located on the side of the inlet mouth of the duct and a second end located on the side of the outlet mouth of the air duct. This advantageous arrangement makes it possible to shape an air flow inside the air duct according to a certain number of parameters related to the vehicle, such as, for example, an aerodynamic profile and/or traveling speeds and/or particular or predefined uses;
  the outlet mouth of the air duct is divided into at least a first sub-duct and a second sub-duct to cool more specifically certain areas of the power module. Each sub-duct thus comprises an outlet mouth of its own;
  in a transverse direction, and preferably in the direction corresponding to the largest dimension of the guiding curve of the air duct, the largest dimension being taken at the outlet mouth of the air duct, the at least two sub-ducts are spaced from each other, the air duct comprising at its outlet mouth a blind zone located between the two sub-ducts. The blind zone corresponds to a part of the outlet mouth which is obstructed, the air guided inside the duct being unable to get out through this obstructed zone. Therefore, the air guided inside the air duct is divided into two independent flows at the outlet mouth, each independent flow being located on either side of the blind zone. The air flows exiting respectively from each of the outlet mouths of the first and second sub-ducts are thus preferably oriented towards specific zones of the power module, possibly in different orientations. This advantageous configuration of the air duct makes it possible to take into account the dimensional stresses of the power module and its surrounding environment inside the engine compartment;

the power module is located in the extension of the blind zone. In this case, the first and second sub-ducts are located on either side of the power module; that is to say that they are located respectively on either side of a main axis of elongation of the power module. This improvement of the air duct cleverly allows not to inject directly on the power module the fresh air coming from the outside and conveyed by the air duct, in order to reduce the pressure exerted by the air flow on the surface facing the power module. This advantageous configuration thus makes it possible to ensure cooling of the power module without introducing mechanical vibrations which could adversely affect its function and/or its durability;

preferably, the two sub-ducts have cross sections whose areas are equal in order to apply an identical air flow to the different zones of the power module facing the outlet mouth(s) of the air duct and, finally, to perform identical cooling on each of the zones. Still preferably, the cross sections of the at least two sub-ducts are identical;

advantageously, the cross sections of the two sub-ducts are collectively less than or equal to 100% of the cross section of the inlet mouth of the air duct;

the air duct comprises a bent portion located between the inlet mouth and the outlet mouth in order to adapt the air duct to the space requirement of the engine compartment and/or the vehicle, bypassing, for example, certain elements located between the inlet mouth of the air duct and the power module;

in particular, the bent portion of the air duct is located in a peripheral position relative to the electric motor. This advantageous configuration close to the electric motor allows for limiting the length of the electrical conductors which convey the power signals between the power module and the electric motor. As mentioned above, the power signals being of high amperage, they are therefore made of a large copper section. This particular configuration of the power module close to the electric motor thus advantageously reduces the manufacturing costs of such a vehicle. Furthermore, it also allows for placement of the power module in a more central position in the vehicle, and in particular to benefit from the significant inertia of the motor to protect the power module in the event of an accident and/or impact on the vehicle.

Advantageously, the air duct of a vehicle according to the first aspect, or any of its improvements, comprises means for controlling the flow of air circulating in the duct so as to be able to control more precisely the flow rate of the air circulating inside the air duct.

The regulating means of the air flow circulating in the air duct are located preferably inside the air duct, between the inlet mouth and the outlet mouth(s).

The regulating means is arranged to modify the effective section of the air duct. In other words, the regulating means is arranged to vary the area of a cross section of the air duct, thus making it possible to control the flow rate of the air circulating in the air duct, and, more particularly, in the portion of the air duct comprised between the regulating means and the outlet mouth(s).

In a vehicle according to the first aspect or any of its first improvements, the regulating means may comprise at least one of the second improvements, taken alternately in combination or in an isolated manner:

the means for controlling the air flow rate may be of any type, and in particular of the type of at least one valve mounted rotatably in the air duct. Alternatively, they may be of the type of at least one load-bearing valve mounted movably in rotation on a wall of the duct, and preferably on one face of the duct situated towards the rear of the duct;

the regulating means is located in at least one of the at least two sub-ducts in order to control more precisely the flow rate of the flow of air circulating in each sub-duct and injected on each corresponding zone of the power module;

the regulating means of the flow rate are arranged to take a position comprised between the two following configurations:
 a first configuration in which the flow rate of air on one side of the regulating means is equal to the flow rate of air on the other side of the regulating means;
 a second configuration in which the air flow on one side of the regulating means is substantially zero. In this second configuration, when the air flow regulating means are, for example, of the type having at least one valve mounted rotatably in the air duct or, according to another equivalent, the regulating means can be arranged for obstructing the air duct hermetically or partially, a residual air flow close to zero being able to flow between the regulating means and the outlet mouth(s), the residual air flow being such that its cooling effect is negligible compared to that achieved in the first configuration. According to another embodiment, when the regulating means of the air flow rate are of the type comprised of at least one valve mounted rotatably on a wall of the air duct, the regulating means can be arranged to guide the air coming from the inlet mouth of the air duct towards the outside of the air duct, so that the air flow located between the regulating means and the outlet mouth(s) is zero or close to zero.

According to a variant embodiment compatible with the second, such a vehicle may subsequently comprise control means arranged for controlling the regulating means between the first and the second configurations. This variant embodiment advantageously allows for controlling the regulating means remotely, and possibly, to automate its operation according to certain parameters of use of the vehicle, such as speed and/or its use, for example, or according to measurement sensors mounted on the vehicle.

The control means can be of any type; they may be, in particular, a microcontroller or a central unit mounted on the vehicle.

Optionally, the regulating means and the control means comprise wired or wireless communication means arranged for issuing and/or receiving instructions and/or measurement data in order to control the configuration of the control means depending eventually on a measurement data returned by an environmental sensor.

Advantageously, in the vehicle according to the first aspect or any of its first and/or second improvements, the power module comprises:
- a plurality of electronic devices each forming an electrical power signal configured to power the electric motor, each electronic device comprising a plurality of electronic components integrally connected to at least one substrate;
- a mechanical support on which the plurality of electronic devices are fixed.

As a non-limiting example, the electronic devices may be of the DC-DC converter type, such as choppers. The incoming electrical signals are, for example, of the type of a DC voltage whose nominal value is between 150V and 600V. The electrical power signals shaped by each electronic device of the power module are preferably of the "Pulse Width Modulation" (PWM) type. Each electronic device performs such a transformation with a frequency and a given duty cycle. Preferably, each electric power signal delivered by each electronic device is out of phase with the others, so that the power module delivers a multiphase power signal to the corresponding electric motor.

Advantageously, such a vehicle may furthermore comprise a cooling system arranged to cool the power module more efficiently, in particular by increasing heat exchanges with the ambient air, and, more particularly, with the air emerging from the air duct.

In such a vehicle, the cooling system may comprise, alternately or complementarily, at least one of the third improvements below possibly taken in combination:
- the cooling system preferably comprises:
  - a plurality of collectors thermally coupled with at least a portion of the electronic devices; and
  - a plurality of thermally coupled heat pipes with the plurality of collectors, the heat pipes being arranged to transport a heat transfer fluid between a first end and a second opposite end. The term heat pipe is understood here in its widest functional sense, that is to say as a duct within which a heat transfer fluid with phase change circulates; and
  - a first group of fins located on a first side of the power module, at least a portion of the fins of the first group being in thermal contact with a portion of the heat pipes; and
  - a second group of fins located on a second side of the power module, at least a portion of the fins of the second group being in thermal contact with a portion of the heat pipes;
- an air flow circulating in the first sub-duct is directed towards the first group of fins, and/or an air flow circulating in the second sub-duct is oriented towards the second group of fins. This clever coupling of the air duct, and more particularly of the first and second sub-ducts, allows for improving the heat exchange at the heat pipes and/or the corresponding fins by orienting the corresponding air flows in the direction of the fins. Preferably, the first group of fins is located in the extension of the outlet mouth of the first sub-duct and/or the second group of fins is located in the extension of the outlet mouth of the second sub-duct. According to another advantageous configuration, the first group of fins may be located in the first sub-duct, and/or the second group of fins may be located in the second sub-duct. Optionally, in the case where the first and second groups of fins are respectively located in the extension of the corresponding sub-ducts, the cooling system may comprise a liner around the groups of fins, the liner forming a duct arranged to guide the air, the liner preferably taking the shape of the corresponding sub-duct;
- the cooling system comprises at least one fan disposed on one face of the first and/or second group of fins, the face being opposite to the outlet mouth of the air duct with respect to the first and/or second group of fins, and preferably, the cooling system comprises a first fan arranged to generate a flow of air at the first group of fins, and a second fan arranged to generate a flow of air at the second group of fins. The at least one fan is more particularly located on one side of the cooling system opposite to the corresponding outlet mouth relative to the group of fins. For example, for the first group of fins associated with the first sub duct, the latter opens on a first face of the group of fins and the associated fan is located in the extension of the first sub duct, beyond the group of fins, on an opposite side of the group of fins relative to the face on which the first sub-duct opens. This advantageous configuration makes it possible to generate a flow of air inside the first and second sub-ducts and the air duct, between the inlet mouth and the outlet mouths, even if the vehicle is stopped and/or when the vehicle is moving at a low speed, as is often the case in urban environments. It is thus possible to improve the cooling of the power module in all vehicle use situations.

Advantageously, the cooling system of a power module included in a vehicle, according to the first aspect or any of its improvements, is arranged in a clever way to allow for increasing the reliability of the cooling system, as well as the robustness of the power module.

This clever configuration, called redundancy, aims to associate at least a portion of the electronic devices of the power module to more than one group of fins. In other words, for at least a portion of the electronic devices, some heat pipes are thermally coupled to a first group of fins, and some other heat pipes are thermally coupled to another group of fins. In this way, each electronic device is cooled by separate subsets of the cooling system.

In a more general way, for each electronic device of the power module:
- a first part of the heat pipes thermally coupled with the electronic device is thermally coupled to the first group of fins; and/or
- a second part of the heat pipes thermally coupled with the electronic device is thermally coupled to the second group of fins; and/or
- a third part of the heat pipes thermally coupled with the electronic device is thermally coupled to the first group of fins and the second group of fins.

All the configurations mentioned above are contemplated in the context of the invention. In particular:
- an electronic device may be thermally coupled to a single group of fins via the heat pipes;
- an electronic device may be thermally coupled to two groups of fins via a first part of the heat pipes which is thermally coupled to the first group of fins and a second part of the heat pipes which is thermally coupled to the second group of fins;
- an electronic device can be thermally coupled to two groups of fins via heat pipes which are thermally and simultaneously coupled to the first and second groups of fins.

All combinations resulting from these three particular configurations are contemplated in the context of the present invention.

A heat pipe, and more generally a duct comprising a heat transfer fluid with phase change of the type of a heat pipe works very well when the fluid is not subjected to a force which prevents its free circulation inside the duct. This so-called static configuration is not necessarily that found on a moving vehicle. Indeed, depending on the use, the vehicle can accelerate or brake, and/or turn left or right. In such situations, called dynamic, a force linked to the longitudinal acceleration—in the case of acceleration or braking of the vehicle—or to the transverse acceleration—in the case of a left or right turn of the vehicle—appears. In the case where such a vehicle would comprise heat pipes, then they would no longer be in the static configuration mentioned above, and their operation would be strongly disrupted.

Indeed, under the effect of a force substantially oriented in the direction of the elongation of a heat pipe, then the heat transfer fluid condensed at a cold end of the heat pipe no longer succeeds as easily to return to a hot point of the heat pipe, and the efficiency of the heat pipe collapses.

This problem is fundamental and most important on a vehicle, and it appears essential to take it into account in the development of a new engine configuration of a motor vehicle.

For this purpose, and according to a first variant of the cooling system compatible with all the improvements of a vehicle according to the first aspect, the heat pipes are oriented in a direction substantially parallel to a traveling direction of the vehicle so that the effect of a turn to the right or left of the vehicle is negligible on the heat pipes.

In this first variant, the first and second sub-ducts are aligned in the longitudinal direction of the vehicle.

According to a second variant of the cooling system compatible with all the improvements of a vehicle according to the first aspect, the heat pipes are substantially oriented in a direction transverse to a traveling direction of the vehicle so that the effect of acceleration or braking on the heat pipes is negligible.

In this second variant, the first and second sub-ducts are aligned in the transverse direction of the vehicle.

Optionally, according to an intermediate variant of the cooling system compatible with all the improvements of a vehicle according to the first aspect, the heat pipes are substantially oriented in a direction between the transverse and longitudinal configurations mentioned above, so that the effects of acceleration or braking and/or turning on the heat pipes are simultaneously reduced, and/or that the heat pipes continue to function in spite of everything.

Surprisingly, the combination of the redundant configuration with one or the other of the foregoing variants in which the heat pipes are substantially oriented in a longitudinal or transverse direction makes it possible to improve the reliability and robustness of the cooling system, allowing thus to effectively cool the power module of a vehicle in all situations of possible use.

Indeed, in the case of a redundant longitudinal configuration, the heat pipes are substantially oriented in the longitudinal direction of the vehicle; and the redundant configuration mentioned above requires that at least part of the heat pipes be located on one side of the power module, the other part of the vehicles being located on the other side of the power module. More particularly, in this configuration, a first portion of the heat pipes is located in front of the power module, and a second portion of the heat pipes is located behind the power module.

In such a configuration, a turn of the vehicle has only a very limited effect on the heat transfer fluid carried by the heat pipes, and the cooling system cools the power module with the same efficiency. On the other hand, in the case of acceleration or braking, the resultant force displaces the fluid carried by the heat pipes respectively towards the rear or towards the front of the heat pipes. This configuration cleverly allows that, for the first part of the heat pipes, the fluid be displaced towards the most forward zone which is located at the first group of fins, corresponding to the cold points of the heat pipes; while, for the second part of the heat pipes, the fluid be displaced towards the most forward zone which is located at the electronic devices, corresponding to the hot points of the heat pipes. Thus, this clever configuration allows operation of the cooling system to at least 50% of its nominal efficiency in a situation of acceleration.

By analogy, in a braking situation, the general behavior of the cooling system is reversed, its resulting efficiency always being greater than or equal to about 50%.

In a comparable manner, in the case of a redundant transverse configuration, the heat pipes are substantially oriented in the transverse direction of the vehicle; and the redundant configuration mentioned above requires that at least part of the heat pipes be located on one side of the power module, the other part of the vehicles being located on the other side of the power module. More particularly, in this configuration, a first part of the heat pipes is located on the right side of the power module, and a second part of the heat pipes is located on the left side of the power module.

In such a configuration, acceleration or braking of the vehicle have only a limited effect on the heat transfer fluid carried by the heat pipes, and the cooling system cools the power module with the same efficiency. On the other hand, in the case of a turn to the right or to the left, the resultant force displaces the fluid carried by the heat pipes respectively to the left or to the right of the heat pipes. Considering a right turn, this configuration cleverly allows that for the first part of the heat pipes, the fluid be moved towards the leftmost zone which is located at the first group of fins, corresponding to the cold points of the heat pipes; while for the second part of the heat pipes, the fluid is moved to the leftmost zone which is located at the electronic devices, corresponding to the hot points of the heat pipes. Thus, this clever configuration allows operation of the cooling system at at least 50% of its nominal efficiency in a situation of acceleration.

By analogy, in a left turn situation, the general behavior of the cooling system is reversed, its resulting efficiency always being greater than or equal to about 50%.

Various embodiments of the invention are provided, integrating, according to all of their possible combinations, the different optional features set forth herein.

DESCRIPTION OF THE FIGURES AND THE EMBODIMENTS

Other features and advantages of the invention will also become apparent from the description that follows, on the one hand, and from several non-limiting embodiments given by way of example, and, on the other hand, with reference to the attached schematic drawings, in which.

Figure 6:
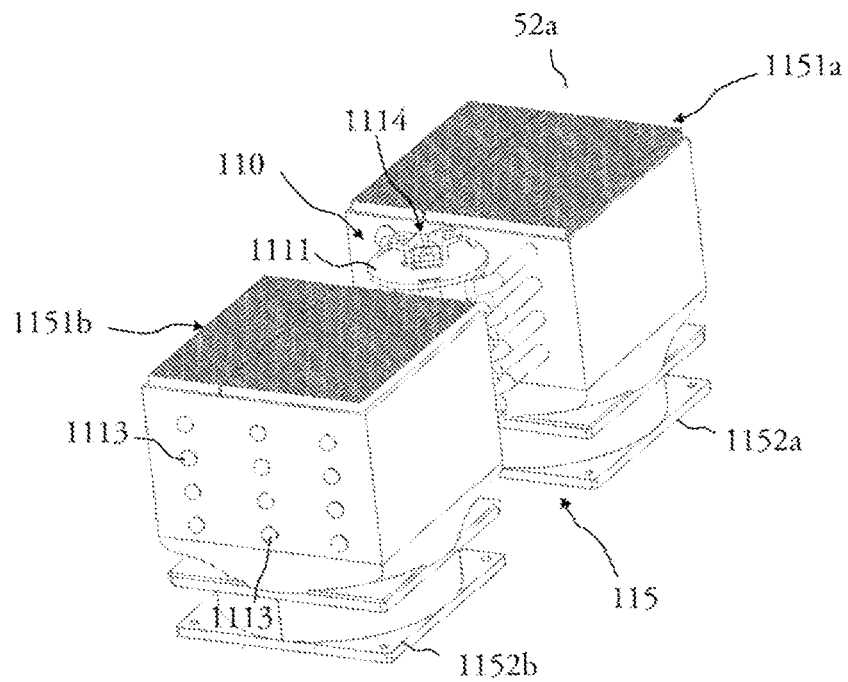
Figure 7:
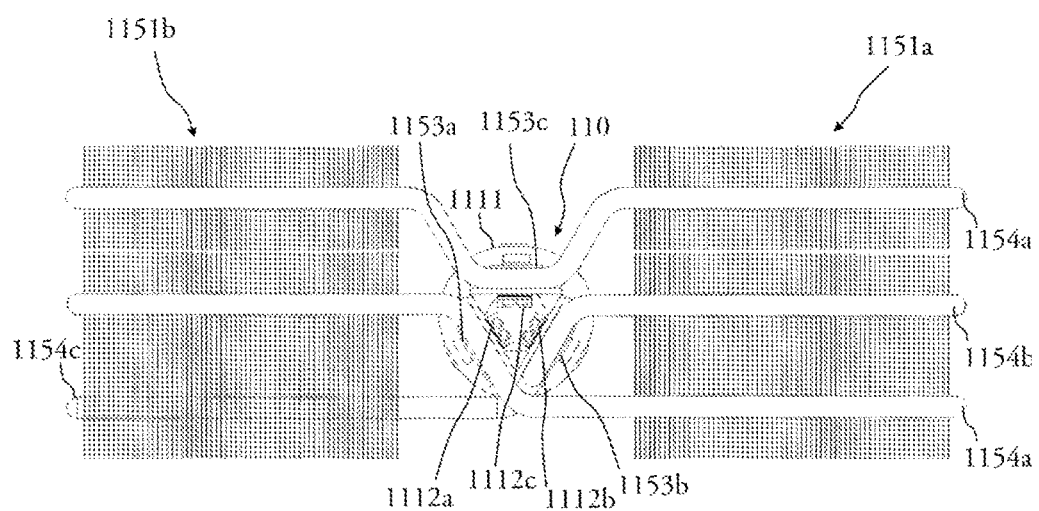

FIG. 6 and FIG. 7 respectively illustrate a perspective view and a front view of a power module and a cooling system, the power module being arranged to control the electric motor of a vehicle according to the first aspect of the invention.

The embodiments that will be described below are in no way limiting; it will be possible to imagine variants of the claimed invention comprising only a selection of the features subsequently described, isolated from the other features described, if this selection of features is sufficient to confer a technical advantage or to differentiate the invention from the state of the art. This selection comprises at least one preferably functional feature without structural details, or with only a part of the structural details if this part alone is sufficient to confer a technical advantage or to differentiate the invention from the state of the prior art.

In particular, all the variants and embodiments described can be combined with one another if there is nothing to prevent this combination from the technical point of view.

In the figures, the elements common to several figures retain the same reference.

Figure 1:
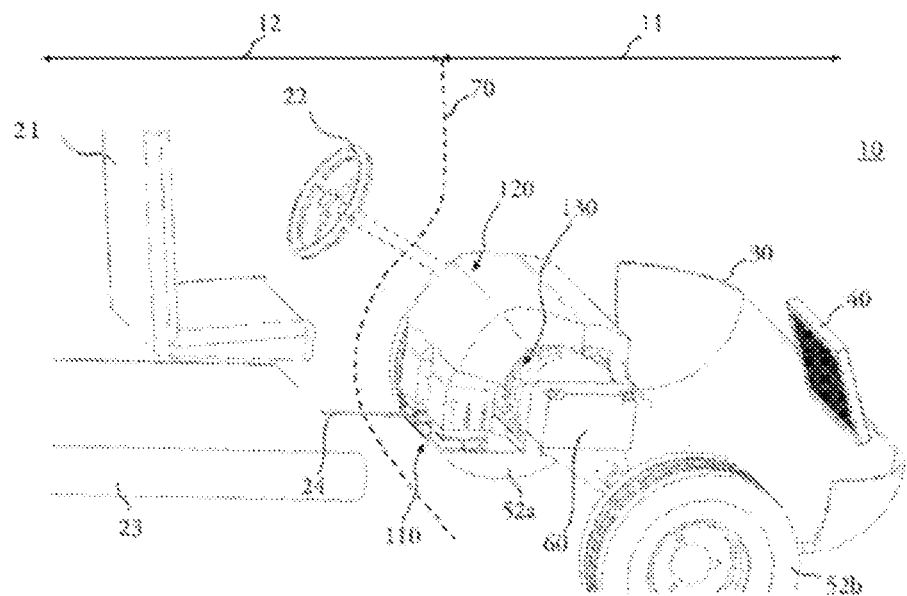
FIG. 1 illustrates a partial perspective view of an electric vehicle according to the first aspect of the invention.
Figure 2:
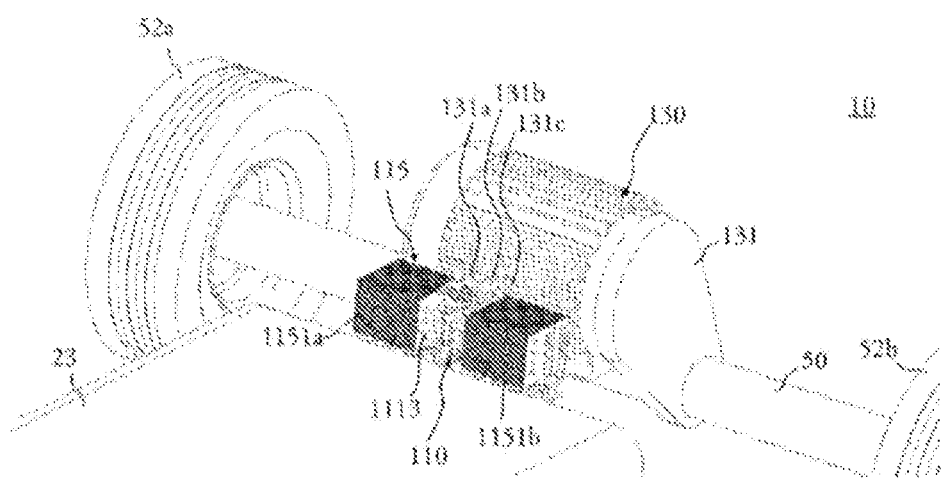
FIG. 2 illustrates a detailed view of the electric motor and the power module which controls it in a transverse implantation.
Figure 3:
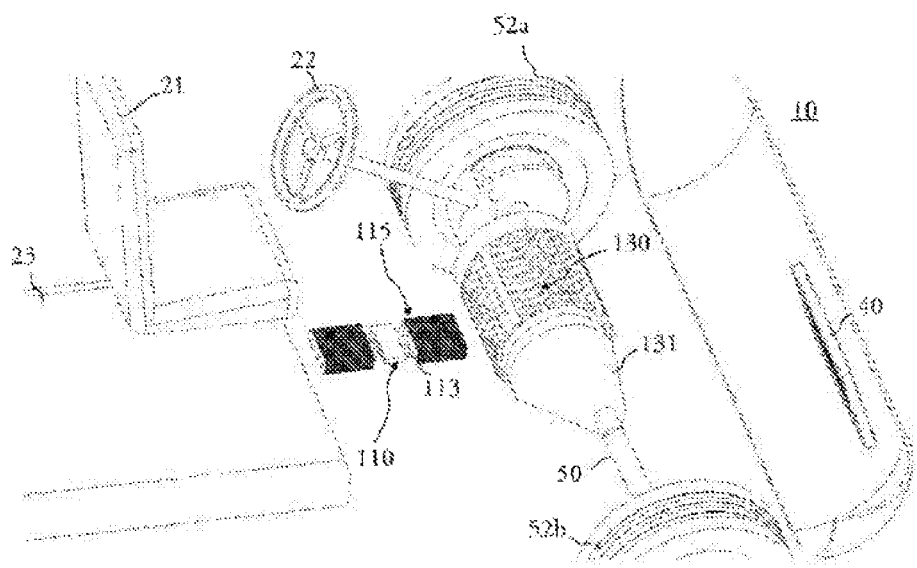
FIG. 3 illustrates a longitudinal implantation of the power module in the engine compartment.

Referring to FIGS. 1, 2 and 3, a motor vehicle 10 comprises (i) an electric motor 130 arranged to propel the vehicle and located in a motor compartment 11, (ii) a passenger compartment 12 of the vehicle 10 separated from the engine compartment 11 by a partition wall 70, (iii) an energy storage device 23 configured to supply electrical energy to the electric motor 130, and (iv) a power module 110 arranged to shape at least one electrical power signal for powering the electric motor 130, the power module 110 being advantageously located between the electric motor 130 and the passenger compartment 12.

The vehicle 10 is bounded at a forward end by a front bumper 30.

In a schematic manner, the passenger compartment 12 comprises at least one seat 21 for the driver and a steering control 22 for steering the vehicle 10. The steering control 22 is mechanically coupled to the front wheels 52a,b so as to be able to modify the orientation thereof by applying a rotational movement on the steering control 22, for example.

The passenger compartment 12 is separated from the engine compartment 11 by a partition wall 70, symbolically represented in FIG. 1 by a dotted line. The partition wall 70, which can be acoustic and/or thermal, is arranged to isolate the engine compartment 11 from the passenger compartment 12 to make the passenger compartment 12 more comfortable and less noisy with respect to the noise generated by the different parts of the engine compartment 11 during operation of the vehicle 10.

In general, the partition wall 70 has a width and a height which correspond to the width of the passenger compartment 12 and the distance between the floor and the base of the windshield (not shown) of the vehicle 10, respectively. The width of the partition wall 70 is here taken in the transverse direction of the vehicle 10.

In the exemplary embodiment illustrated in FIGS. 1, 2 and 3, the engine compartment 11 comprises:
- the electric motor 130, here in a central configuration, the vehicle 10 comprising an electric motor arranged to generate a driving torque on the front driving wheels 52 a,b;
- a power module 110 arranged to provide the electric motor 130 with at least one electrical power signal;
- an air duct 120 arranged to guide the air along a guiding profile, between an inlet mouth located on a front portion of the vehicle 10, and at least one outlet mouth located at the power module 110. The air duct 120 will be described in detail later and with reference to FIG. 4. In the example shown in FIG. 1, the air duct 120 assumes a concave shape; it is located peripherally to the electric motor 130, the air duct 120 wrapping around a portion of the electric motor 130.

The power module is electrically connected to a main battery 23 via at least one electrical conductor 24. The main battery 23 of the vehicle 10 forms an energy storage device, the main battery 23 being configured to provide electrical energy to the power module 110 and, ultimately, to the electric motor 130.

In the exemplary embodiment illustrated in FIGS. 1, 2 and 3, the main battery 23 is located behind the engine compartment 11 with respect to the partition wall 70, and, more particularly, under the passenger compartment 12 or possibly in the lower part of the passenger compartment 12.

As a non-limiting example, the main battery 23 of the vehicle may provide the power module 110 with electrical signals of the type of a DC voltage whose nominal value is between 150V and 600V and whose amperage may reach several hundred amperes. The power module 110 is arranged to cause the electrical signal coming from the main battery 23 to be at least one electrical power signal, preferably of the "Pulse Width Modulation" (PWM) type, this type of electrical signal being particularly advantageous for controlling an electric motor. This electrical transformation is carried out by the power module according to at least one frequency and according to at least one given duty cycle.

The power module 110 is preferably arranged to provide the electric motor 130 with a plurality of multiphase power electrical signals, each electrical power signal possibly being out of phase with respect to the others.

The power module 110 may advantageously comprise a plurality of DC-DC converters, such as choppers. The power module and its cooling system 115 that can be associated with it will be described later with reference to FIGS. 6 and 7.

The power module 110 is also electrically connected to the electric motor 130 by means of a plurality of output conductors 131a-131c which are arranged to carry the electric power signals generated by the power module 110 to the electric motor 130. More particularly, each output conductor 131a-c carries a phase of the multiphase electrical signal generated by the power module 110. Each electrical conductor 131a-c is electrically connected to a separate power supply terminal—not shown—of the electric motor 130.

The electric motor 130 is mechanically coupled to the front driving wheels 52 a,b by means of a transmission arranged to transmit a motor torque produced by the electric motor 130 to a transmission shaft 50 integral in rotation with the front wheels 52 a,b.

Complementarily, the vehicle 10, according to the first aspect of the invention and illustrated in FIG. 1, further comprises:
- a cooling system 40, for air conditioning of the passenger compartment 12, located longitudinally in front of the vehicle and behind the bumper 30;
- a set of accessories 60 located near the electric motor 130 to provide electric power to the electrical auxiliaries of the vehicle 10. In the example shown in FIG. 1, the set of accessories 60 is located on a lateral side of the engine 130, transversely between the engine 130 and one of the front wheels 52 a,b.

The power module 110 and/or the associated cooling system 115 may be advantageously arranged and oriented according to two advantageous configurations illustrated respectively in FIG. 2 and FIG. 3.

Generally speaking, the orientation of the power module 110 may be of any type: longitudinal or transverse, or even vertical, as well as in all directions between these three reference orientations.

The cooling system 115 is advantageously oriented in a longitudinal or transverse configuration with respect to the vehicle 10, so as to limit the impact of a longitudinal and transverse acceleration, respectively, on the cooling system 115.

According to a first alternative illustrated in FIG. 2, the power module 110 is preferably oriented substantially vertically with respect to the vehicle 10. The cooling system 115 associated with the power module 110 is in turn oriented substantially transversely relative to the vehicle 10. More particularly, the cooling system 115 comprises a plurality of heat pipes 1113, at least a portion of which is substantially oriented transversely to the vehicle 10. A first part of the heat pipes 1113 extends on a first side of the power module 110 located on the side of a first front wheel 52a; and a second part of the heat pipes 1113 extends on a second side of the power module 110, the second side being located transversely on the opposite side to the first side with respect to the power module 110, on the side of the other front wheel 52b. In this advantageous configuration, the cooling system 115 is less sensitive to the effects of a centrifugal force on the heat transfer fluid carried by the heat pipes which occurs when the vehicle turns.

According to a second alternative illustrated in FIG. 3, the power module 110 is oriented substantially vertically with respect to the vehicle 10. The cooling system 115 associated with the power module 110 is in turn oriented substantially longitudinally with respect to the vehicle 10. More particularly, the cooling system 115 comprises a plurality of heat pipes 1113, part of which at least being substantially oriented longitudinally to the vehicle 10. A first part of the heat pipes 1113 extends on a first side of the power module 110 located in the front; and a second part of the heat pipes 1113 extends on a second side of the power module 110, the second side being located longitudinally on the opposite side to the first side with respect to the power module 110, towards the rear. In this advantageous configuration, the cooling system 115 is less sensitive to the effects of braking or acceleration of the vehicle 10 on the heat transfer fluid carried by the heat pipes.

The cooling system 115 will be described in greater detail with reference to FIG. 6.

Figure 4:
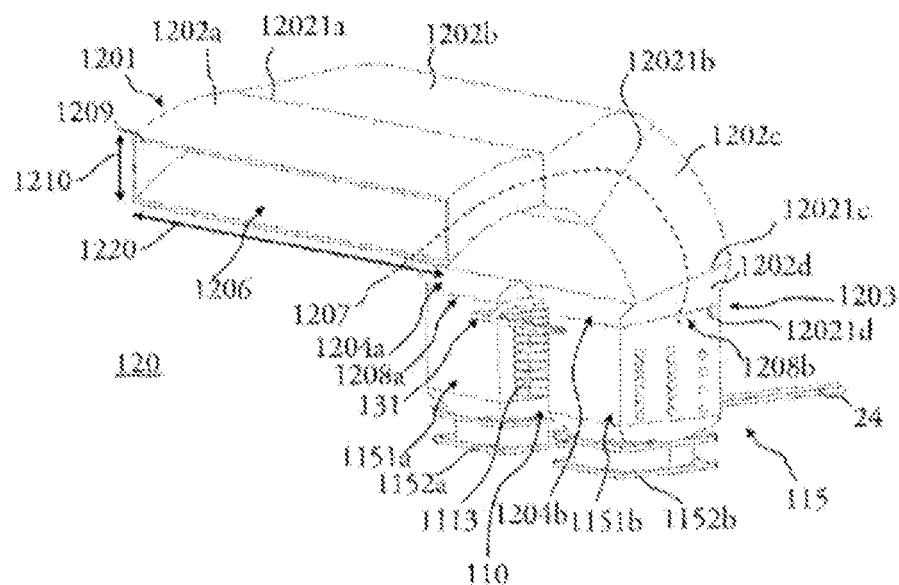
FIGS. 4 and 5 illustrate a detailed view of the air duct used to cool the power module.

With reference to FIG. 4, the air duct 120 for cooling the power module 110 will now be described.

Generally speaking, the air duct 120 is formed by a pipe arranged for guiding the air along a guiding profile 1207, between an inlet mouth 1206 located at a first end 1201 and an outlet mouth 1208a,b located at a second end 1203.

The walls of the air duct 120 are preferably made of a material of small thickness. The air duct 210 is advantageously made of metal and/or plastic.

The outlet mouth 1208 is preferably located at the power module 110, in any orientation. In the embodiment shown in FIG. 1, the guiding profile 1207 is oriented in a substantially vertical orientation at the second end 1203.

The inlet mouth 1206 is preferably located in a more frontal position of the vehicle 10 with respect to the outlet mouth 1208.

The orientation of the guiding profile 1207 at the first end 1201 is substantially horizontal.

The guiding profile 1207 may have any shape between the first end 1201 and the second end 1203, in particular according to the space available inside the engine compartment 11 and/or the vehicle 10. It can be straight or curvilinear or comprise a plurality of rectilinear segments 1202 a-d and/or curved segments, each segment 1202 a-d being located in the extension of the directly adjacent segment 1202 a-d.

In the example shown in FIG. 4, the guiding profile 1207 of the air duct 120 comprises four consecutive segments 1202a-1202d. The first segment 1201 comprises the inlet mouth 1206. The segments 1202a-1202d are all curvilinear, each curvilinear segment having a particular radius of curvature, so that the segments 1202a-1202d all have a substantially concave shape.

The air duct 120 has a transverse section which is formed by a closed guiding curve 1209 and extends, on the one hand, in a first direction 1210 and, on the other hand, in a second direction 1220. The shape of the guide curve 1209 makes it possible to shape an air flow inside the air duct 120 between the inlet mouth 1206 and the outlet mouth 1208.

In the example shown in FIG. 4, the transverse section of the air duct 120 is formed by a guide curve 1209 which is substantially rectangular. Other shapes are possible depending on the shaping of the desired air flow.

For this purpose, the shape and/or the dimensions of the guiding curve 1209 may vary between the first end 1201 and the second end 1203. In particular, each segment 1202a-d of the air duct 120 may be formed by a particular guiding curve 1209, possibly constant over the entire length of the guiding profile 1207 of the segment 1202a-d. Alternatively, or additionally, the guiding curve 1209 of at least part of the segments 1202a-d of the air duct 120 may vary between a first end of a segment and a second end of a segment.

In the example shown in FIG. 4:
the guiding curve 1209 of the first segment 1202a has a first direction 1210 which is constant between the inlet mouth 1206 and its opposite end 12021a. In the second direction 1220, the guiding curve 1209 is greater at the inlet mouth 1206 than at its opposite end 12021a;
the first direction 1210 of the guiding curve 1209 of the second segment 1202b varies increasingly between its first end 12021a and its opposite end 12021b. In the second direction 1220, the guiding curve 1209 of the second segment 1202b has a dimension that is constant between its first end 12021a and its opposite end 12021b;
the first dimension 1210 and the second dimension 1220 of the guiding curve 1209 of the third segment 1202c are respectively constant between its first end 12021b and its opposite end 12021c;
the first dimension 1210 of the guiding curve 1209 of the fourth segment 1202d decreases between its first end 12021c and its opposite end 12021d. In the second direction 1220, the guiding curve 1209 of the fourth segment 1202d has a dimension that decreases between its first end 12021c and its opposite end 12021d.

Furthermore, the air duct 120 is divided into two sub-ducts 1204 a,b at its second end 1203, and, more particularly, at its fourth segment 1202d. Thus, the air duct 120 is formed of two outlet mouths 1208 a,b, each being located at the end of each sub-ducts 1204 a,b. Each sub-duct 1204 a,b is formed by a guiding curve coming from the guiding curve 1209 of the duct 120, and, more precisely, from the shape of the guiding curve 1209c of the third segment 1202c. In the example shown in FIG. 4, the guiding curves of each sub-duct are identical. Advantageously, the lengths of the fourth segments of each sub-duct are identical.

The first sub-duct 1204a is detached and transversely spaced from the second sub-duct 1204b, so that a blind zone 1205 is formed between the two sub-ducts 1204a,b. The blind zone 1205 is delimited laterally by the walls of each sub-duct 1204a,b.

The power module 110 is cleverly housed inside the blind zone 1205, between the two sub-ducts 1204a,b. Preferably, the power module 110 extends in an orientation corresponding to the extension of the guiding profile 1207 of the air duct 120 taken from the outlet mouths 1208a,b. More particularly, the power module extends beyond the plane formed by the outlet mouths 1208a,b of the air duct 120, in the direction defined above.

Figure 5:
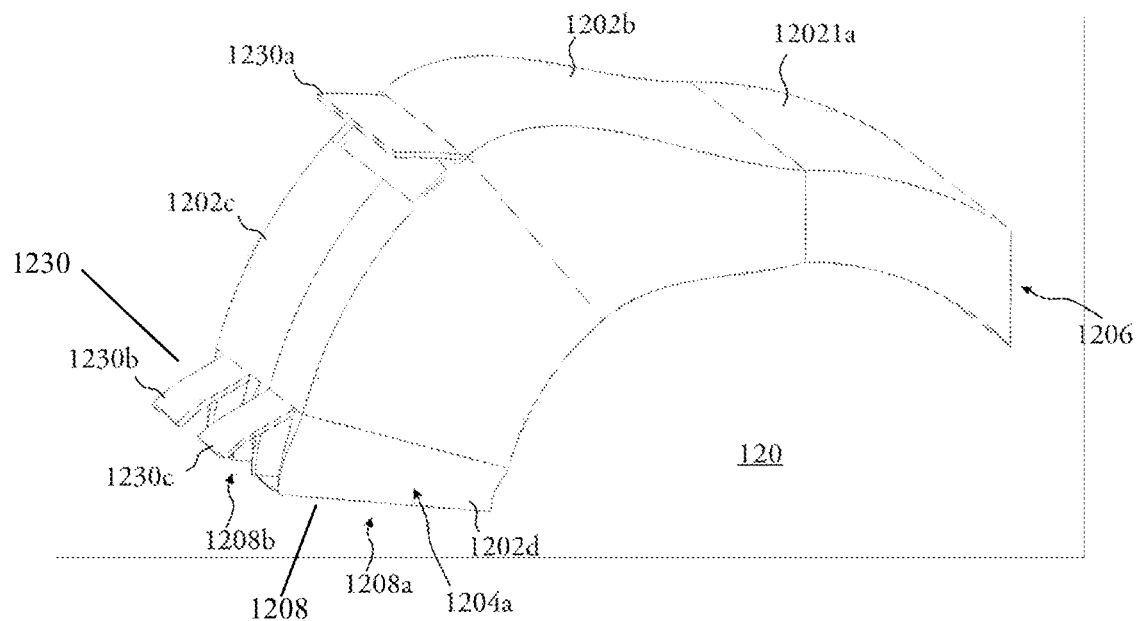

FIG. 5 illustrates a perspective view of the profile of an air duct according to an embodiment of the invention, in which the regulating means 1230 of the air flow rate is of the type comprising at least one mobile valve rotatably mounted on a wall of the air duct 120.

More particularly, the regulating means 1230 of the air duct 120 comprises:
 a first mobile control valve 1230a rotatably mounted on a rear wall of the third segment 1202c of the air duct 120;
 a second mobile control valve 1230b rotatably mounted on the first sub-duct 1204a; and
 a third mobile control valve 1230c rotatably mounted on the first sub-duct 1204a.

Each control valve 1230a-c is rotatable about an axis of rotation transverse to the wall of the air duct 120.

The flow control valves 1230a-c are arranged to take a position between the two following configurations:
 a first configuration in which the air flow rate on one side of the control valves 1230a-c is equal to the air flow rate on the other side of the control valves 1230a-c. In the embodiment illustrated in FIG. 5, this first configuration corresponds to a closed configuration of the control valves for which the control valves 1230a-c form a continuous wall of the air duct 120;
 a second configuration in which the air flow rate on one side of the control valves 1230a-c is substantially zero. In the embodiment illustrated in FIG. 5, this second configuration corresponds to an open configuration of the control valves for which the control valves 1230a-c form an opening in the wall of the air duct 120.

The control valves 1230a-c are arranged to take any configuration between the open configuration and the closed configuration defined above.

Each control valve is located on a rear face of the air duct 120, and more particularly on a face located outside the concavity of the air duct 120, so that when one of the control valves 1230a-c is open, the flow of air circulating in the air duct 120 between the inlet mouth 1206 and the control valve is mainly oriented outwardly of the duct. The flow rate of the residual air flowing between the open control valve and the outlet mouth is zero or virtually zero.

This particular embodiment makes it possible to effectively control the flow rate of air exiting through the outlet mouths 1208a,b, without reducing the section of the air duct 120 and while maintaining a good transverse distribution of air at the outlet mouths 1208a,b. Moreover, this particular embodiment makes it possible not to increase the pressure drop.

With reference to FIGS. 4, 6 and 7, the power module 110 comprises:
 a plurality of electronic devices 1112a-c each shaping an electrical power signal configured to power the electric motor 130, each electronic device 1112a-c comprising a plurality of electronic components integrally connected to at least one substrate;
 a mechanical support 1111 on which the plurality of electronic devices 1112a-c is fixed integrally;
 an inlet connector (not visible) arranged to electrically connect the power module 120 to the energy storage device 23;
 an outlet connector 1114 arranged to electrically connect each electronic device with a conductor to carry the power signals generated by each electronic device 1112a-c to the electric motor 130.

Advantageously, the mechanical support 1111 of the power module 110 has a cylindrical shape. The electronic devices 1112a-c are advantageously carried by the mechanical support so that their substrate is radially oriented towards the outside, the electronic components being radially oriented towards the inside.

The electronic devices are preferably arranged on the mechanical support 1111 in a polygonal configuration, each side of the polygon being formed by a bearing face and/or assembly on the radially inner portion of the cylindrical mechanical support 1111.

In the embodiment illustrated in FIGS. 6 and 7, the power module 110 comprises three electronic devices 1112a-c arranged in a triangle with respect to one another.

In the embodiment illustrated in FIGS. 4, 6 and 7, the power module 110 also comprises a cooling system 115 arranged to cool the power module 110, the cooling system 115 comprising:
 a plurality of collectors 1153a-c in thermal coupling with at least part of the electronic devices 1112, and more particularly in thermal coupling with the substrate of the corresponding electronic devices 1112a-c and/or with the mechanical support 1111;
 a plurality of heat-pipes 1154a-c in thermal coupling with the plurality of collectors 1153a-c, the heat pipes 1154a-c extending radially beyond the power module 120;
 a first group of fins 1151a being located on a first side of the power module 110 and in thermal contact with part of the heat pipes 1154 in order to improve the heat transfer of the heat transported by the heat pipes 1154 with the external medium;
 a second group of fins 1151b located on a second side of the power module 110 and in thermal contact with part of the heat pipes 1154 in order to improve the heat transfer of the heat transported by the heat pipes 1154 with the external medium;
 a first fan 1152a arranged to generate an air flow at the first group of fins 1151a;
 a second fan 1152b arranged to generate an air flow at the second group of fins 1151b.

Each power module 110 is thermally coupled to a plurality of heat pipes 1154a-c via the collectors 1153a-c. The collectors 1153a-c are distributed on one face of the substrate of the electronic devices 1112a-c and/or on one face opposite to the mechanical support 1111 so as to allow transferring the heat produced at the electronic devices 1112a-c during their operation to the collectors 1153a-c and, finally, to the associated heat pipes 1154a-c.

The heat pipes 1154a-c are arranged to carry to a terminal end the heat transferred to the corresponding collectors 1153a-c As shown in FIG. 7, several configurations are possible for each electronic device 1112a-c.

According to a first configuration, an electronic device 1112b may be associated with a plurality of first heat pipes 1154b which extend radially beyond the power module 110 on a first side of the power module 110. These first heat pipes 1154b are thermally coupled to a first group of fins 1151a located on the first side of the power module 110. A first end of the first heat pipes 1154b is thus located at the corresponding electronic device 1112b in order to extract the heat. A second end of the second heat pipes 1154b is located beyond the first group of fins 1151a, so that the heat transfer fluid carried by these first heat pipes 1154b passes through a rectilinear portion thermally coupled to the first group of fins 1151a.

An electronic device 1112 can thus be thermally connected to a single first group of fins 1151a or 1151b. In other words, the heat pipes 1154 of an electronic device 1112 can all be thermally coupled to a single group of fins 1151.

Alternatively, an electronic device 1112 can be thermally connected to two groups of fins 1151 via a first group of heat pipes 1154b in thermal coupling with the electronic device 1112 and thermally coupled to the first group of fins 1151a, and a second part of the heat pipes 1154c in thermal coupling with the electronic device 1112 and thermally coupled to the second group of fins 1151b.

According to a second configuration, the electronic devices 1112a, 112c are associated with a plurality of third heat pipes 1154a, which extend radially beyond the power module 110 on a first side of the power module 110 and on a second side of the power module 110. These third heat pipes 1154a are thus thermally coupled to a first group of fins 1151a located on the first side of the power module 110 and to a second group of fins 1151b located on the second side of the power module 110.

A first end of the third heat pipes 1154b is thus located beyond the first group of fins 1151a, so that the heat transfer fluid carried by these third heat pipes 1154b passes through a rectilinear portion thermally coupled to the first group of fins 1151a. A second end of the third heat pipes 1154b is located beyond the second group of fins 1151b, so that the heat transfer fluid carried by these third heat pipes 1154b passes through a rectilinear portion thermally coupled to the second group of fins 1151a.

The power module 110 is thus thermally coupled to a plurality of heat pipes including:
- a first part of the heat pipes 1154b is thermally coupled to the first group of fins 1151a;
- a second part of the heat pipes 1154b is thermally coupled to the second group of fins 1151b;
- a third part of the heat pipes 1154a is thermally coupled to the first group of fins 1151a and to the second group of fins 1151b.

The power module 110 is thus cleverly cooled by a cooling system 115 implementing the principle of redundancy previously defined.

Advantageously, the cooling system further comprises an outer liner around the first and second groups of fins 1151, the liner forming an extension of the air duct 120 beyond the outlet mouths 1208.

Advantageously, the cooling system cooperates with the air duct 120. More particularly, the first and second groups of fins 1151 are located in the extension of the outlet mouths 1208. In particular, each group of fins is resting on the corresponding outlet mouth 1208.

The dimensions and the shape of the guiding curve of the air duct 120 are advantageously combined with the dimensions and the shape of the first and second groups of fins 1151.

Of course, the invention is not limited to the examples that have just been described and many improvements can be made to these examples without departing from the scope of the invention. In particular, the various features, shapes, variants and embodiments of the invention may be associated with each other in various combinations to the extent that they are not incompatible or exclusive of each other. In particular, all the variants and embodiments described above can be combined with each other.

The invention claimed is:

1. A motor vehicle comprising:
an electric motor located in a motor compartment of the vehicle, said electric motor being arranged to propel the vehicle;
a passenger compartment of the vehicle separated from the motor compartment by a partition wall;
an energy storage device configured to supply electrical energy to the electric motor;
a power module located between the electric motor and the passenger compartment arranged to shape at least one electrical power signal configured to supply the electric motor;
wherein the vehicle comprises at least one air duct arranged to guide air along a guiding profile between an inlet mouth located on a front portion of said vehicle and an outlet mouth located at the power module.

2. The vehicle according to claim 1, wherein the air duct is arranged so that the speed of outgoing air at the outlet mouth is greater than the speed of air entering at the inlet mouth.

3. The vehicle according to claim 1, wherein the outlet mouth of the air duct is divided into at least a first sub-duct and a second sub-duct.

4. The vehicle according to claim 3, wherein in a transverse direction, the at least two sub-ducts are spaced from each other; the air duct comprising at its inlet mouth a blind zone located between said first and second sub-ducts, the power module being located in an extension of the blind zone.

5. The vehicle according to claim 1, wherein the air duct comprises regulating means for regulating the flow rate of air circulating in said air duct; the regulating means of the flow rate being arranged to take a position between the two following configurations:
a first configuration in which the flow rate of air on one side of the regulating means is equal to the flow rate of air on the other side of said regulating means;
a second configuration in which the flow rate of air on one side of the regulating means is substantially zero.

6. The vehicle according to claim 1, wherein the power module comprises:
a plurality of electronic devices, each electronic device shaping an electrical power signal configured to power the electric motor, each electronic device comprising a plurality of electronic components integrally bonded to at least one substrate;
a mechanical support on which the plurality of electronic devices is severally fixed;
a cooling system arranged to cool the power module.

7. A motor vehicle comprising:
an electric motor located in a motor compartment of the vehicle, said electric motor being arranged to propel the vehicle;
a passenger compartment of the vehicle separated from the motor compartment by a partition wall;
an energy storage device configured to supply electrical energy to the electric motor;
a power module located between the electric motor and the passenger compartment comprising:

a plurality of electronic devices, each electronic device shaping an electrical power signal configured to power the electric motor, each electronic device comprising a plurality of electronic components integrally bonded to at least one substrate;

a mechanical support on which the plurality of electronic devices is severally fixed;

a cooling system arranged to cool the power module, wherein the cooling system comprises:

a plurality of collectors in thermal coupling contact with at least part of the electronic devices;

a plurality of heat pipes in thermal contact with the plurality of collectors, said heat pipes being arranged to carry a heat transfer fluid between a first end and a second opposite end;

a first group of fins located on a first side of the power module, at least part of the fins of the first group being in thermal contact with part of the heat pipes;

a second group of fins located on a second side of the power module, at least part of the fins of the second group being in thermal contact with part of the heat pipes.

8. The vehicle according to claim 7, wherein the vehicle comprises at least one air duct arranged to guide air along a guiding profile between an inlet mouth located on a front portion of said vehicle and an outlet mouth located at the power module, the outlet mouth of the air duct being divided into at least a first sub-duct and a second sub-duct; and wherein an air flow circulating in the first sub-duct is oriented towards the first group of fins, and/or an air flow circulating in the second sub-duct is oriented towards the second group of fins.

9. The vehicle according to claim 8, wherein the first group of fins is located in an extension of the outlet mouth of the first sub-duct and/or the second group of fins is located in an extension of the outlet mouth of the second sub-duct.

10. The vehicle according to claim 7, wherein the heat pipes are oriented in a direction substantially parallel to a traveling direction of the vehicle.

11. The vehicle according to claim 7, wherein the heat pipes are substantially oriented in a direction transverse to a traveling direction of the vehicle.

12. The vehicle according to claim 7, wherein, for each electronic device of the power module:

a first part of the heat pipes thermally coupled to said electronic device is thermally coupled to the first group of fins; and/or a second part of the heat pipes thermally coupled with said electronic device is thermally coupled to the second group of fins; and/or a third part of the heat pipes thermally coupled with said electronic device is thermally coupled to the first group of fins and to the second group of fins.

13. The vehicle according to claim 7, wherein the cooling system comprises at least one fan provided on one face of the first and/or second group of fins, said face being opposite to the outlet mouth of the air duct with respect to said first and/or second group of fins.

14. The vehicle according to claim 7, wherein the cooling system comprises a first fan arranged to generate an air flow at the first group of fins, and a second fan arranged to generate an air flow at the second group of fins.

* * * * *